United States Patent
Lei et al.

(10) Patent No.: US 8,980,727 B1
(45) Date of Patent: Mar. 17, 2015

(54) SUBSTRATE PATTERNING USING HYBRID LASER SCRIBING AND PLASMA ETCHING PROCESSING SCHEMES

(71) Applicant: Applied Materials, Inc., Santa Clara, CA (US)

(72) Inventors: Wei-Sheng Lei, San Jose, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/272,111

(22) Filed: May 7, 2014

(51) Int. Cl.
*H01L 21/00* (2006.01)
*H01L 21/3065* (2006.01)
*C03C 15/00* (2006.01)
*H01L 21/768* (2006.01)

(52) U.S. Cl.
CPC ............ *H01L 21/3065* (2013.01); *C03C 15/00* (2013.01); *H01L 21/76898* (2013.01)
USPC ........... 438/462; 438/460; 438/463; 438/464; 438/465; 257/E21.599; 257/E21.602; 257/E21.606

(58) Field of Classification Search
None
See application file for complete search history.

(56) References Cited

U.S. PATENT DOCUMENTS

| | | | |
|---|---|---|---|
| 4,049,944 A | 9/1977 | Garvin et al. | |
| 4,339,528 A | 7/1982 | Goldman | |
| 4,684,437 A | 8/1987 | Donelon et al. | |
| 5,336,638 A | 8/1994 | Suzuki et al. | |
| 5,593,606 A | 1/1997 | Owen et al. | |
| 5,635,423 A * | 6/1997 | Huang et al. | 438/638 |
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Powell | |
| 6,306,731 B1 | 10/2001 | Igarashi et al. | |
| 6,407,363 B2 | 6/2002 | Dunsky et al. | |

(Continued)

FOREIGN PATENT DOCUMENTS

| | | |
|---|---|---|
| JP | 9216085 | 8/1997 |
| JP | 10321908 | 12/1998 |

(Continued)

OTHER PUBLICATIONS

Linder, V. et al., "Water-Soluble Sacrificial Layers for Surface Micromachining", www.small-journal.com, 2005, 1, No. 7, 7 pgs.

(Continued)

*Primary Examiner* — Mohsen Ahmadi
(74) *Attorney, Agent, or Firm* — Blakely Sokoloff Taylor Zafman LLP

(57) ABSTRACT

Approaches for patterning semiconductor or other wafers and dies are described. For example, a method of patterning features within a substrate involves forming a mask layer above a surface of a semiconductor or glass substrate. The method also involves laser ablating the mask layer to provide a pattern of openings through the mask layer. The method also involves plasma etching portions of the semiconductor or glass substrate through the pattern of openings to provide a plurality of trenches in the semiconductor or glass substrate. The plurality of trenches has a pattern corresponding to the pattern of openings and comprising a pattern of through-substrate-via openings or redistribution layer (RDL) openings. The method also involves, subsequent to the plasma etching, removing the mask layer.

5 Claims, 6 Drawing Sheets

(56) References Cited

U.S. PATENT DOCUMENTS

| | | |
|---|---|---|
| 6,426,275 B1 | 7/2002 | Arisa |
| 6,465,158 B1 | 10/2002 | Sekiya |
| 6,528,864 B1 | 3/2003 | Arai |
| 6,574,250 B2 | 6/2003 | Sun et al. |
| 6,582,983 B1 | 6/2003 | Runyon et al. |
| 6,593,542 B2 | 7/2003 | Baird et al. |
| 6,642,127 B2 | 11/2003 | Kumar et al. |
| 6,676,878 B2 | 1/2004 | O'Brien et al. |
| 6,696,669 B2 | 2/2004 | Hembree et al. |
| 6,706,998 B2 | 3/2004 | Cutler |
| 6,759,275 B1 | 7/2004 | Lee et al. |
| 6,803,247 B2 | 10/2004 | Sekiya |
| 6,887,804 B2 | 5/2005 | Sun et al. |
| 6,998,571 B2 | 2/2006 | Sekiya et al. |
| 7,105,456 B2 * | 9/2006 | Leith et al. .................. 438/733 |
| 7,128,806 B2 | 10/2006 | Nguyen et al. |
| 7,129,150 B2 | 10/2006 | Kawai |
| 7,179,723 B2 | 2/2007 | Genda et al. |
| 7,265,033 B2 | 9/2007 | Shigematsu et al. |
| 7,361,990 B2 | 4/2008 | Lu et al. |
| 7,364,986 B2 | 4/2008 | Nagai et al. |
| 7,435,607 B2 | 10/2008 | Nagai |
| 7,459,377 B2 | 12/2008 | Ueda et al. |
| 7,468,309 B2 | 12/2008 | Shigematsu et al. |
| 7,473,866 B2 | 1/2009 | Morishige et al. |
| 7,507,638 B2 | 3/2009 | Mancini et al. |
| 7,507,639 B2 | 3/2009 | Nakamura |
| 7,629,228 B2 | 12/2009 | Haji et al. |
| 7,678,670 B2 | 3/2010 | Arita et al. |
| 7,687,740 B2 | 3/2010 | Bruland et al. |
| 7,754,584 B2 | 7/2010 | Kumakawa |
| 7,767,551 B2 | 8/2010 | Arita et al. |
| 7,767,554 B2 | 8/2010 | Arita et al. |
| 7,776,720 B2 | 8/2010 | Boyle et al. |
| 7,804,043 B2 | 9/2010 | Deshi |
| 7,838,323 B2 | 11/2010 | Utsumi et al. |
| 7,859,084 B2 | 12/2010 | Utsumi et al. |
| 7,875,898 B2 | 1/2011 | Maeda |
| 7,906,410 B2 | 3/2011 | Arita et al. |
| 7,923,351 B2 | 4/2011 | Arita |
| 7,926,410 B2 | 4/2011 | Bair |
| 7,927,973 B2 | 4/2011 | Haji et al. |
| 2003/0162313 A1 | 8/2003 | Kim et al. |
| 2004/0080045 A1 | 4/2004 | Kimura et al. |
| 2004/0137700 A1 | 7/2004 | Sekiya |
| 2004/0157457 A1 | 8/2004 | Xu et al. |
| 2004/0212047 A1 | 10/2004 | Joshi et al. |
| 2006/0043535 A1 | 3/2006 | Hiatt |
| 2006/0086898 A1 | 4/2006 | Cheng et al. |
| 2006/0088984 A1 | 4/2006 | Li et al. |
| 2006/0146910 A1 | 7/2006 | Koochesfahani et al. |
| 2006/0205182 A1 | 9/2006 | Soejima |
| 2009/0255911 A1 | 10/2009 | Krishnaswami et al. |
| 2010/0013036 A1 | 1/2010 | Carey |
| 2010/0173474 A1 * | 7/2010 | Arita et al. .................. 438/462 |
| 2010/0248451 A1 | 9/2010 | Pirogovsky et al. |
| 2011/0312157 A1 | 12/2011 | Lei et al. |
| 2013/0045554 A1 | 2/2013 | Yamazaki |
| 2013/0065378 A1 | 3/2013 | Johnson et al. |
| 2013/0230972 A1 | 9/2013 | Johnson et al. |

FOREIGN PATENT DOCUMENTS

| | | |
|---|---|---|
| JP | 2001127011 | 5/2001 |
| JP | 2001144126 | 5/2001 |
| JP | 2003179005 | 6/2003 |
| JP | 2004031526 | 1/2004 |
| JP | 2004055684 | 2/2004 |
| WO | WO-03036712 | 5/2003 |
| WO | WO-03071591 | 5/2003 |

OTHER PUBLICATIONS

Singh, Saravjeet et al., "Apparatus and Methods for Dry Etch With Edge, Side and Back Protection", U.S. Appl. No. 61/491,693, filed May 31, 2011 24 pgs.

* cited by examiner

SUBSTRATE PATTERNING USING HYBRID LASER SCRIBING AND PLASMA ETCHING PROCESSING SCHEMES

BACKGROUND

1) Field

Embodiments of the present invention pertain to the field of semiconductor processing and, in particular, to methods of patterning semiconductor or other wafers and dies.

2) Description of Related Art

In three-dimensional (3D) packaging applications, in addition to through silicon via (TSV) formation and redistribution layer (RDL) pattern formation for a silicon (Si) wafer, glass substrates have also been proposed for interposer fabrication. Accordingly, through glass via formation and RDL pattern formation approaches may be advantageous.

The use of plasma etch technology for TSV and redistribution layer pattern formation in Si wafers will need to be made more cost effective in order to gain industry acceptance. In the case of using a glass substrate as an interposer, through glass via (TGV) and redistribution layer (RDL) pattern formation is needed. There is great potential for cost savings, but no consensus has reached on suitable TGV and RDL pattern formation processes. Laser ablation has been proposed but such a process faces the same factors in its competition with plasma etch for TSV and RDL pattern formation in a Si wafer, such as heat affected zone, thermal damage, via size control, etc.

SUMMARY

Embodiments of the present invention include methods of patterning semiconductor or other wafers and dies.

In an embodiment, a method of patterning features within a substrate involves forming a mask layer above a surface of a silicon substrate. The method also involves laser ablating the mask layer to provide a pattern of openings through the mask layer. The method also involves plasma etching portions of the silicon substrate through the pattern of openings to provide a plurality of trenches in the silicon substrate without dicing the silicon substrate. The plurality of trenches has a pattern corresponding to the pattern of openings.

In another embodiment, a method of patterning features within a substrate involves forming a mask layer on a surface of a glass substrate. The method also involves laser ablating the mask layer to provide a pattern of openings through the mask layer. The method also involves plasma etching portions of the glass substrate through the pattern of openings to provide a plurality of trenches in the glass substrate without dicing the glass substrate. The plurality of trenches has a pattern corresponding to the pattern of openings.

In another embodiment, a method of patterning features within a substrate involves forming a mask layer above a surface of a semiconductor or glass substrate. The method also involves laser ablating the mask layer to provide a pattern of openings through the mask layer. The method also involves plasma etching portions of the semiconductor or glass substrate through the pattern of openings to provide a plurality of trenches in the semiconductor or glass substrate. The plurality of trenches has a pattern corresponding to the pattern of openings and having a pattern of through-substrate-via openings or redistribution layer (RDL) openings. The method also involves, subsequent to the plasma etching, removing the mask layer.

DETAILED DESCRIPTION

Figure 1A:
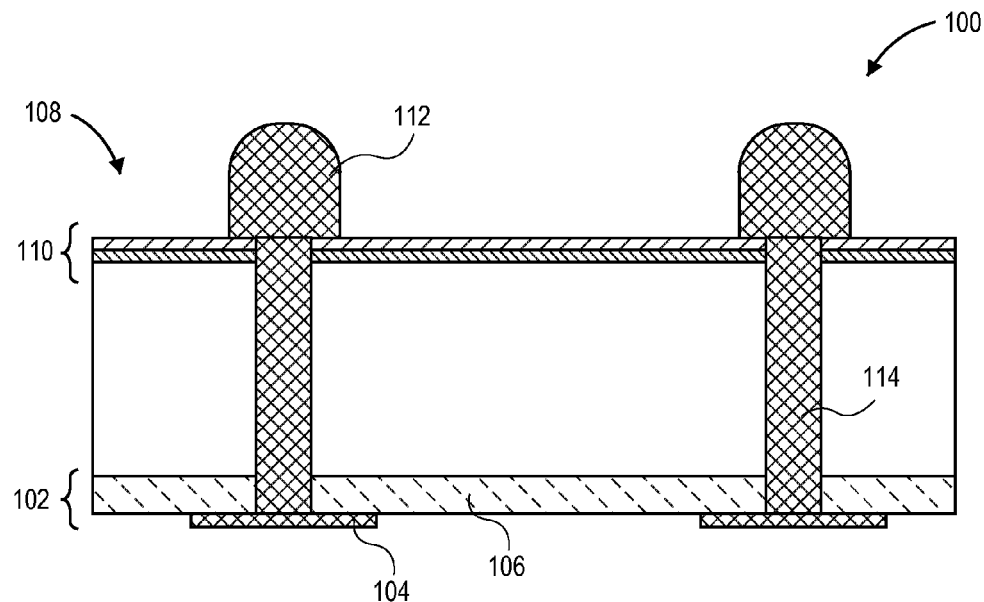
FIG. 1A illustrates a cross-sectional view of a substrate having vias formed there through, in accordance with another embodiment of the present invention.

Approaches for patterning semiconductor or other wafers and dies are described. In the following description, numerous specific details are set forth, such as femtosecond-based laser scribing and plasma etching conditions and material regimes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid processes involving initial laser scribing and subsequent plasma treatment may be implemented for substrate via formation or redistribution layer (RDL) patterning. The laser scribe process may be used to cleanly remove one or more of a mask layer and inorganic insulating or dielectric layers on a front side of a wafer. The substrate or RDL may then be subjected to plasma etch treatment for patterning. Such hybrid processes may be performed on whole wafers or on already-diced, singulated individual dies.

More particularly, in accordance with one or more embodiments described herein, for plasma etch technology implemented for through silicon via (TSV) and redistribution layer pattern formation in a silicon (Si) wafer, laser ablation is used to replace expensive photo-resist (PR) lithography processes for mask patterning. In one such embodiment, much cheaper polyimide, polyvinyl alcohol (PVA), or other laser absorbing polymer materials or less expensive PR materials are used to replace expensive PR materials as a suitable mask material. Furthermore, in one embodiment, laser ablation is also used to remove portions of a dielectric layer with good quality, reducing etch time.

In accordance with one or more other embodiment, in the case of using glass substrate as an interposer, inexpensive polyimide, PVA, other laser absorbing polymer materials, or less expensive PR materials are used as a mask material. Laser ablation is implemented for mask patterning, followed by plasma etching to form through glass via (TGV) or RDL patterning in the glass substrate. Such approaches may advantageously avoid microcracking, chipping, or thermal damage in the glass substrate as is often associated with laser drilling. Furthermore, approaches described herein may provide high quality TGV structures suitable for metal deposition.

In both cases, i.e., using a silicon of glass substrate, since the required mask layer thickness may typically be in the range of 3-10 microns, in an embodiment, single pulse ablation is used to remove the entire mask thickness or mask and dielectric layer thickness. Laser ablation of such thin masks can ensure combined high quality and decent throughput.

It is to be appreciated that processes described herein can be used to accommodate fabrication of a variety of architectures involving TSV, TGV or RDL patterning. In a first example, FIG. 1A illustrates a cross-sectional view of a substrate having vias formed there through, in accordance with another embodiment of the present invention. Referring to FIG. 1A, a structure 100, such as a die or interposer, has a front surface 102 having metal pads 104 on a device or passivation layer 106. A backside 108 of the structure 100 includes dielectric and/or passivation layers 110, as may also include solder bumps 112, such as copper bumps. Through silicon vias (TSVs) or through glass vias (TGVs) 114 connect the pads 104 with the bumps 112 and run through the silicon or glass substrate.

Figure 1B:
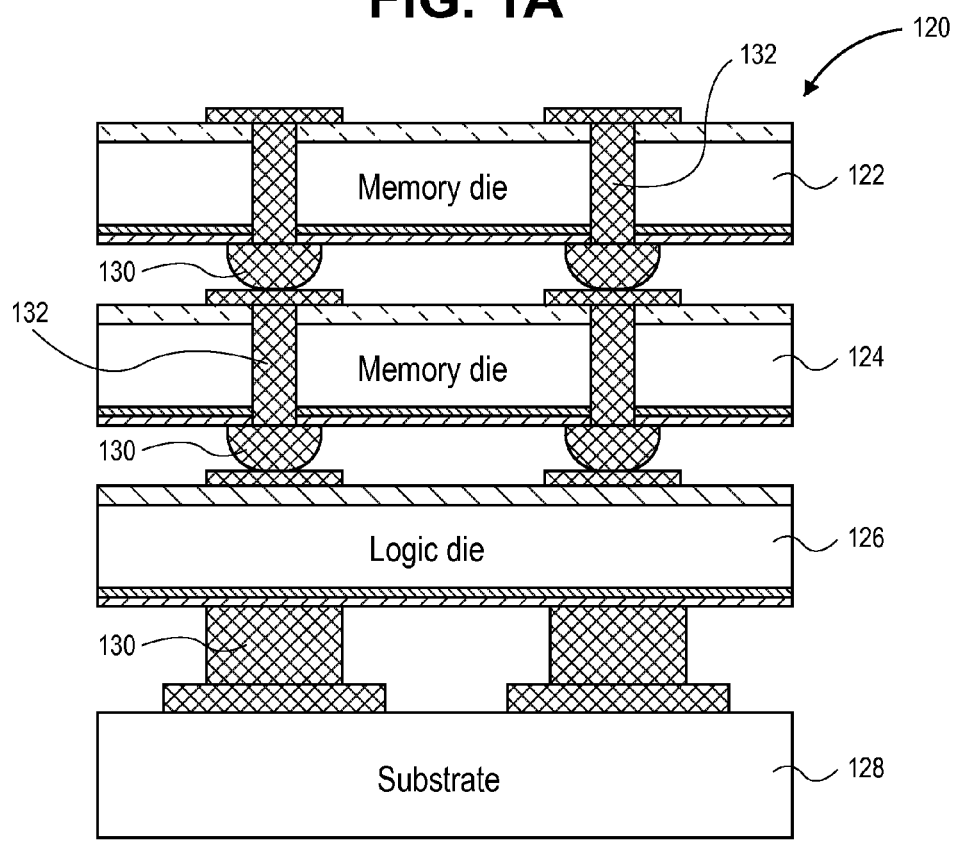
FIG. 1B illustrates a cross-sectional view of a stack of dies as coupled to a package substrate, in accordance with an embodiment of the present invention.

In a second example, FIG. 1B illustrates a cross-sectional view of a stack of dies as coupled to a package substrate, in accordance with an embodiment of the present invention. Referring to FIG. 1B, a logic die/memory die hybrid 3-D stacking structure 120 includes a first memory die 122 coupled to a second memory die 124. The second memory die 124 is coupled to a logic die 126. The logic die 126 is coupled to a package substrate 128. As depicted in FIG. 1B, the coupling can be effected by use of backside bumps 130 and TSVs 132. It is to be appreciated that, although not depicted in FIG. 1B, an underfill material may be included between substrate/die, or die/die in final products as a passivation layer.

Figure 2:
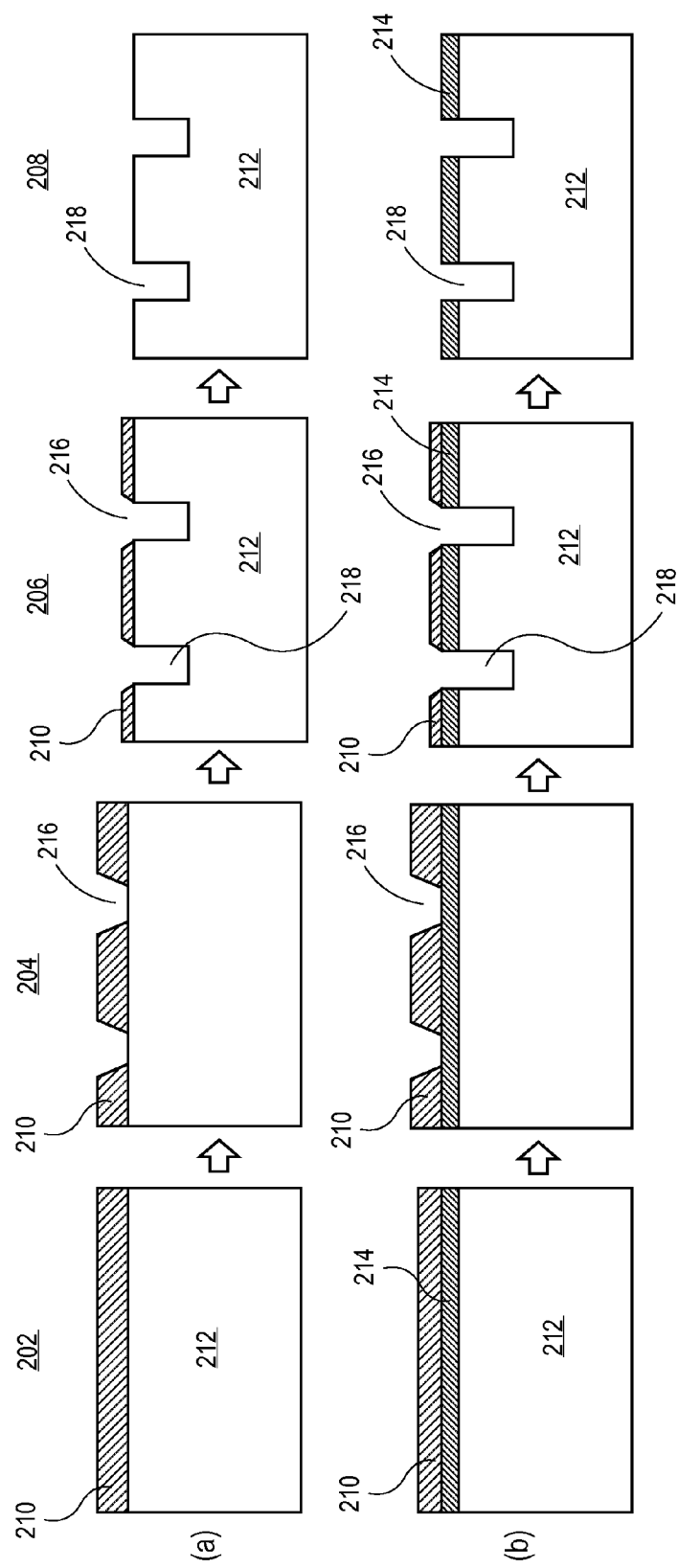
FIG. 2 illustrates various stages in conventional process flows (a) and (b) for through silicon via (TSV) or redistribution layer patterning formation in a silicon (Si) substrate.

To provide context, FIG. 2 illustrates various stages in conventional process flows (a) and (b) for through silicon via (TSV) or redistribution layer patterning formation in a silicon (Si) substrate. Referring to stage 202, a photo-resist (PR) mask 210 is formed on a silicon substrate 212 (process flow (a)) or on an insulating or dielectric layer 214, such as a $SiO_2$ insulating or dielectric layer, formed on a silicon substrate 212 (process flow (b)). Referring to stage 204, the photo-resist mask 210 is patterned using lithography (e.g., exposure and development) to form openings 216 therein. Referring to stage 206, at least a portion of the silicon substrate 212 (process flow (a)) or the dielectric layer 214 and at least a portion of the silicon substrate 212 (process flow (b)) is plasma etched through the openings 216 in the photo-resist layer 210 to provide TSV or RDL patterning 218. Referring to stage 208, the photo-resist-layer 210 is removed by plasma ashing and solvent removal of the residual mask material. Referring again to FIG. 2, it is to be appreciated that the process flows (a) and (b) involve the use of expensive photo-resist material and photolithography processes.

In a first aspect, historically, plasma etch and laser drilling were competing technologies for through Si via (TSV) formation and redistribution layer pattern formation, but in accordance with one or more embodiments described herein, plasma etch is now the technology of choice for much better quality, via-to-via consistency, and throughput. As an example, FIG. 3 illustrates various stages in process flows (a) and (b) for through silicon via (TSV) or redistribution layer patterning formation in a silicon (Si) substrate, in accordance with an embodiment of the present invention.

Figure 3:
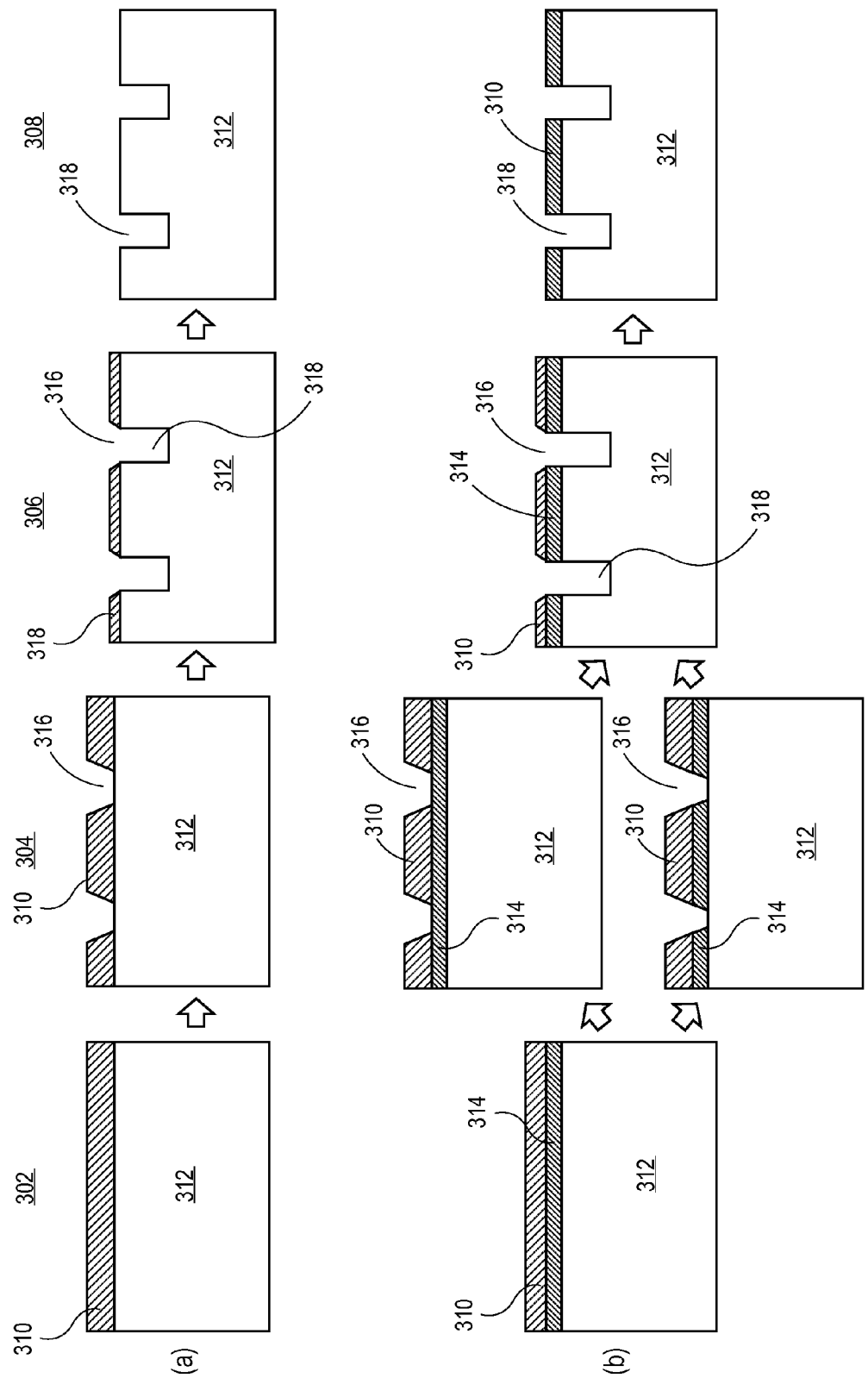
FIG. 3 illustrates various stages in process flows (a) and (b) for through silicon via (TSV) or redistribution layer patterning formation in a silicon (Si) substrate, in accordance with an embodiment of the present invention.

Referring to FIG. 3, at stage 302, a relatively less expensive mask layer 310 is formed on a silicon substrate 312 (process flow (a)) or on an insulating or dielectric layer 314, such as a $SiO_2$ insulating or dielectric layer, formed on a silicon substrate 312 (process flow (b)). Referring to stage 304, the mask layer 310 is patterned using laser scribing to form openings 316 therein. In one such embodiment, referring to process flow (b) both the mask layer 312 and the dielectric layer 314 are patterned (option (ii)). However, the laser scribing may terminate on or partially into the dielectric layer 314 (option (i)). Referring to stage 306, at least a portion of the silicon substrate 312 (process flow (a) or process flow (b) part (ii)) or the dielectric layer 314 and at least a portion of the silicon substrate 312 (process flow (b) part (i)) is plasma etched through the openings 316 in the mask layer 310 to provide TSV or RDL patterning 318. Referring to stage 308, the mask layer 310 is removed by plasma ashing and/or solvent/water cleaning to remove residual mask material. In an embodiment, the mask layer 310 is a relatively inexpensive polyimide or polyvinyl alcohol (PVA) or other laser absorbing polymer instead of an expensive conventional photo-resist material.

Referring again to FIG. 3, in an embodiment, then, a method of patterning features within a substrate involves forming a mask layer above a surface of a silicon substrate. The mask layer is laser ablated to provide a pattern of openings through the mask layer. Portions of the silicon substrate are plasma etched through the pattern of openings to provide a plurality of trenches in the silicon substrate without dicing the silicon substrate. The plurality of trenches has a pattern corresponding to the pattern of openings.

It is to be appreciated that, in one embodiment, each of the plurality of trenches extends through the entire thickness of the silicon substrate. Nonetheless, the etched pattern does not lead to dicing or substrate portion singulation, such as die singulation. Instead, in one embodiment, the pattern of the plurality of trenches is a pattern of through-silicon-via (TSV) openings. In another embodiment, the pattern of the plurality of trenches is a pattern of redistribution layer (RDL) openings. Furthermore, the silicon substrate described may be a complete or whole silicon wafer, or may be a portion of an already-singulated silicon wafer.

Referring again to FIG. 3, in one embodiment, the mask layer is formed on an insulating layer formed on the surface of the silicon substrate. In one specific such embodiment, the mask layer, but not the insulating layer, is laser ablated. The plasma etching further involves etching portions of the insulating layer through the openings to provide the pattern in the insulating layer. In another specific such embodiment, the mask layer and the insulating layer are both laser ablated to provide the pattern of openings in the mask layer and in the insulating layer. In an alternative embodiment, the mask layer is formed on the surface of the silicon substrate.

More generally, in an embodiment, the substrate 312 is composed of a material suitable to withstand a fabrication process and upon which semiconductor or other processing layers may suitably be disposed. For example, in one embodiment, the substrate 312 is composed of a group IV-based material such as, but not limited to, crystalline silicon, germanium or silicon/germanium. In a specific embodiment, the substrate 312 is a monocrystalline silicon substrate. In a particular embodiment, the monocrystalline silicon substrate is doped with impurity atoms. In another embodiment, the substrate 312 is composed of a material such as, e.g., a material substrate used in the fabrication of light emitting diodes (LEDs).

In an embodiment, the substrate 312 may include an array of semiconductor devices on a surface of the substrate 312 opposite the surface having the mask layer 310 thereon. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. One or more of the dielectric layers can be a low-k dielectric layer. A low K dielectric layer is a layer having a dielectric constant of less than the dielectric constant of 4.0 for silicon dioxide.

In a second aspect, embodiments are directed to through glass via (TGV) or redistribution layer patterning formation in a glass substrate. It is to be appreciated that processes for TGV and redistribution layer pattern formation in a glass substrate for use as an interposer have not been commercialized. For example, laser drilling to form such TGV structures has not proven viable. One reason may be that since the subsequent via filling via metal deposition has rigorous requirements for the via side wall quality and via to via consistency, laser drilling of the glass substrate may not be of sufficient quality. Furthermore, throughput may be a big challenge for laser drilling technology, as encountered for laser drilling of TSVs. The feasibility of laser drilling to form TGV and redistribution layer pattern in a glass substrate for high volume manufacturing may not be viable. By contrast, FIG. 4 illustrates various stages in a hybrid laser scribe and plasma etch process flow for through glass via (TGV) or redistribution layer patterning formation in a glass ($SiO_2$) substrate, in accordance with an embodiment of the present invention.

Figure 4:
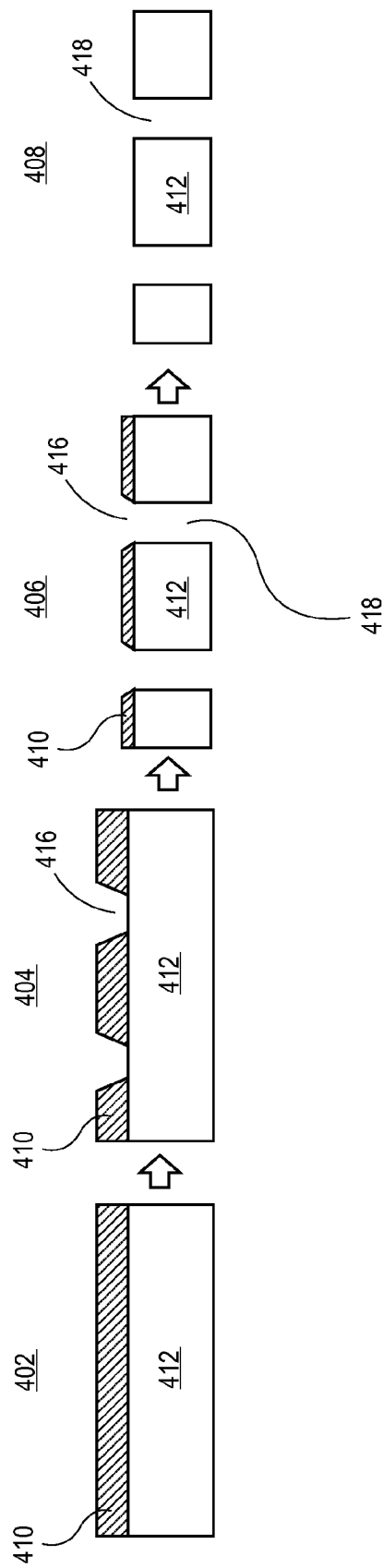
FIG. 4 illustrates various stages in a process flow for through glass via (TGV) or redistribution layer patterning formation in a glass ($SiO_2$) substrate, in accordance with an embodiment of the present invention.

Referring to FIG. 4, at stage 402, a relatively less expensive mask layer 410 is formed on a glass substrate 412. Referring to stage 404, the mask layer 410 is patterned using laser scribing to form openings 416 therein. Referring to stage 406, at least a portion of the glass substrate 412 is plasma etched through the openings 416 in the mask layer 410 to provide TGV or RDL patterning 418. Referring to stage 408, the mask layer 410 is removed by plasma ashing and/or solvent/water cleaning to remove residual mask material. In an embodiment, the mask layer 410 is a relatively inexpensive polyimide or polyvinyl alcohol (PVA) or other laser absorbing polymer instead of an expensive conventional photo-resist material. In an embodiment, the use of plasma etching for TGV and redistribution layer pattern formation of a glass substrate ensures consistent and good via quality for metal deposition, avoiding cracking or thermal damage otherwise inherent to a laser drilling process. In one such embodiment, laser scribing is limited to the mask layer and is not used to form the structure within the substrate itself.

Referring again to FIG. 4, in an embodiment, then, a method of patterning features within a substrate involves forming a mask layer on a surface of a glass substrate. The mask layer is laser ablated to provide a pattern of openings through the mask layer. Portions of the glass substrate are plasma etched through the pattern of openings to provide a plurality of trenches in the glass substrate without dicing the glass substrate. The plurality of trenches has a pattern corresponding to the pattern of openings.

It is to be appreciated that, in one embodiment, each of the plurality of trenches extends through the entire thickness of the glass substrate. Nonetheless, the etched pattern does not lead to dicing or substrate portion singulation. Instead, in one embodiment, the pattern of the plurality of trenches is a pattern of through-glass-via (TGV) openings. In another embodiment, the pattern of the plurality of trenches is a pattern of redistribution layer (RDL) openings. Furthermore, the glass substrate described may be a complete or whole glass wafer, or may be a portion of an already-singulated glass wafer.

Referring again to both FIGS. 3 and 4, generally, a wide variety of laser options may be available for mask layer patterning. In an embodiment, an ultra-violet (UV) laser is used and has a wavelength regime approximately in the range of 300 to 400 nanometers. In one embodiment, for more absorbing polymers such as polyimide, epoxy resin, etc., nanosecond UV laser pulses are implemented for pulse width. In the case of TSV and RDL pattern formation in a silicon substrate bearing an upper dielectric layer such as $SiO_2$, in one embodiment, a picosecond or femtosecond laser with an infra-red (IR), green or ultra-violet (UV) wavelength is used for both mask and inorganic dielectric layer patterning with minimal delamination at the inorganic dielectric/Si interface. However, it is to be appreciated that, depending on inorganic dielectric thickness, a nanosecond (UV) laser can instead be used to pattern both the mask and inorganic dielectric layer with high quality.

As mentioned above, in an embodiment, the laser scribing is a single pulse ablation process in that each region exposed to the laser is subjected to only one pulse of the laser source. In one embodiment, a top hat imaged beam is used. However, a clipped Gaussian beam or a Gaussian laser beam profile may also be suitable. In an embodiment, the laser scribing is performed such that substantially all of the ablation occurs above the substrate and not within the substrate, preserving a significant majority of the substrate patterning (e.g., semiconductor or glass substrate patterning) to the plasma etch processing.

In the case that the mask layer 310 or 410 is a water-soluble mask layer, in an embodiment, the water-soluble layer is readily dissolvable in an aqueous media. For example, in one embodiment, the water-soluble layer is composed of a material that is soluble in one or more of an alkaline solution, an acidic solution, or in deionized water. In an embodiment, the water-soluble layer maintains its water solubility upon a heating process, such as heating approximately in the range of 50-160 degrees Celsius. For example, in one embodiment, the water-soluble layer is soluble in aqueous solutions following exposure to chamber conditions used in a laser and plasma etch patterning process. In one embodiment, the water-soluble mask layer is composed of a material such as, but not limited to, polyvinyl alcohol, polyacrylic acid, dextran, polymethacrylic acid, polyethylene imine, or polyethylene oxide. In a specific embodiment, the water-soluble layer has an etch rate in an aqueous solution approximately in the range of 1-15 microns per minute and, more particularly, approximately 1.3 microns per minute. In another specific embodiment, the water-soluble layer is formed by a spin-on technique.

In the case that the mask layer 310 or 410 is a UV-curable mask layer, in an embodiment, the mask layer has a susceptibility to UV light that reduces an adhesiveness of the UV-curable layer by at least approximately 80%. In one such embodiment, the UV layer is composed of polyvinyl chloride or an acrylic-based material. In an embodiment, the UV-curable layer is composed of a material or stack of materials with an adhesive property that weakens upon exposure to UV light. In an embodiment, the UV-curable adhesive film is sensitive to approximately 365 nm UV light. In one such embodiment, this sensitivity enables use of LED light to perform a cure.

As mentioned above, in an embodiment, etching the semiconductor (e.g., silicon) or glass wafer or substrate includes using a plasma etching process. In one embodiment, an ultra-high-density plasma source is used for the plasma etching portion of the substrate patterning process. An example of a process chamber suitable to perform such a plasma etch process is the Applied Centura® Silvia™ Etch system available from Applied Materials of Sunnyvale, Calif., USA. The Applied Centura® Silvia™ Etch system combines the capacitive and inductive RF coupling, which gives much more independent control of the ion density and ion energy than was possible with the capacitive coupling only, even with the improvements provided by magnetic enhancement. This combination enables effective decoupling of the ion density from ion energy, so as to achieve relatively high density plasmas without the high, potentially damaging, DC bias levels, even at very low pressures. This results in an exceptionally wide process window. However, any plasma etch chamber capable of treating and/or etching silicon or glass may be used. In a specific embodiment, the etch process is used to etch a silicon substrate and is based on a plasma generated from a reactive gas, which generally a fluorine-based gas such as $SF_6$, $C_4F_8$, $CHF_3$, $XeF_2$, or any other reactant gas capable of etching silicon at a relatively fast etch rate.

In an embodiment, a through-silicon via type etch process is used for the plasma etching operation described in association with FIG. 3. For example, in a specific embodiment, the etch rate of the material of the silicon substrate 312 is greater than 25 microns per minute. In an exemplary embodiment, a deep silicon etch is used to etch a single crystalline silicon substrate or wafer at an etch rate greater than approximately 40% of conventional silicon etch rates while maintaining essentially precise profile control and virtually scallop-free sidewalls. In another embodiment, the plasma etching operation described in association with FIG. 3 employs a conventional Bosch-type dep/etch/dep process to etch through the substrate. Generally, a Bosch-type process consists of three sub-operations: deposition, a directional bombardment etch, and isotropic chemical etch which is run through many iterations (cycles) until silicon is etched through. However, as a result of the Bosch process, the sidewall surface takes a scallop structure which can be rough. In addition, the deposition sub-step in a Bosch process generates a fluorine-rich Teflon-type organic film to protect the already etched sidewall which is not removed from the sidewall as the etch front proceeds (generally such polymer is only removed periodically from the bottom of the anisotropically etched trench). Accordingly, following the anisotropic Bosch-type plasma etch operation, in an embodiment, an isotropic chemical wet or plasma etch is applied to smoothen the sidewall by gently etching a thin layer of substrate (e.g., silicon) off the side wall. In an embodiment, the isotropic portion of the etching is based on a plasma generated from a combination of $NF_3$ and $CF_4$ as the etchant for sidewall smoothening treatment. Also, a higher bias power such as 1000 W is used. In an embodiment, an advantage of using a plasma generated from a combination of $NF_3$ and $CF_4$ as an etchant for sidewall smoothening lies in the lower isotropic etch rate (approximately 0.15 um/min) so the smoothening treatment is more controllable. The high bias power is applied to achieve relatively high directional etch rates to etch off the ridges or rims on the sidewall.

A single process tool may be configured to perform many or all of the operations in a hybrid laser scribing and plasma etching process for through substrate or redistribution layer patterning. For example, FIG. 5 illustrates a block diagram of a tool layout for hybrid laser scribing and plasma etching for through substrate or redistribution layer patterning, in accordance with an embodiment of the present invention.

Figure 5:
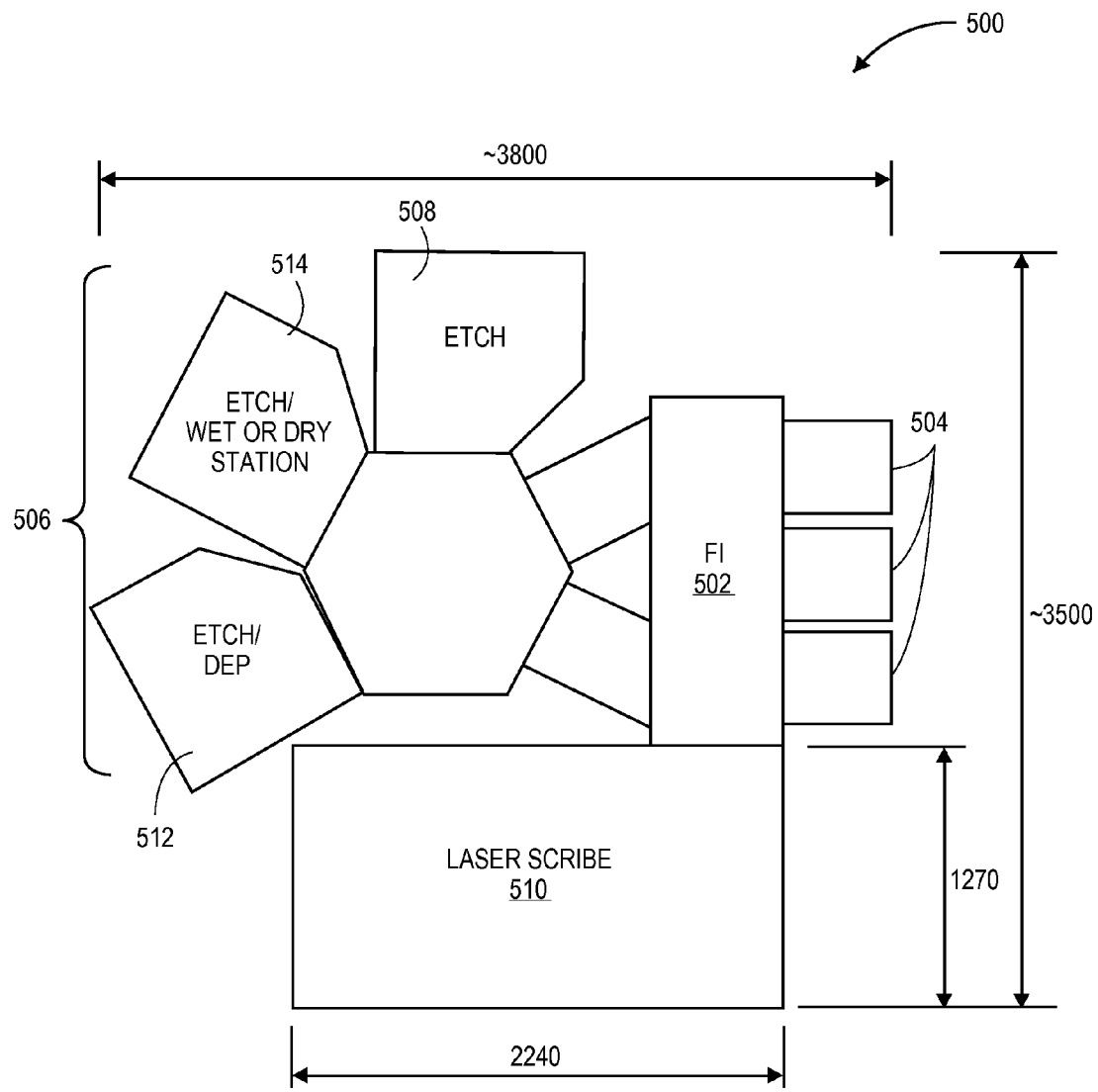
FIG. 5 illustrates a block diagram of a tool layout for hybrid laser scribing and plasma etching for through substrate or redistribution layer patterning, in accordance with an embodiment of the present invention.

Referring to FIG. 5, a process tool 500 includes a factory interface 502 (FI) having a plurality of load locks 504 coupled therewith. A cluster tool 506 is coupled with the factory interface 502. The cluster tool 506 includes one or more plasma etch chambers, such as plasma etch chamber 508. A laser scribe apparatus 510 is also coupled to the factory interface 502. The overall footprint of the process tool 500 may be, in one embodiment, approximately 3500 millimeters (3.5 meters) by approximately 3800 millimeters (3.8 meters), as depicted in FIG. 5.

In an embodiment, the laser scribe apparatus 510 houses a nanosecond, picosecond- or femtosecond-based laser, and preferably a femto-second based laser. The nanosecond, picosecond- or femtosecond-based laser is suitable for performing a laser ablation portion of a laser and etch through substrate or redistribution layer patterning process, such as the laser abalation processes described above. In one embodiment, a moveable stage is also included in laser scribe apparatus 500, the moveable stage configured for moving a wafer or substrate (or a carrier thereof) relative to the picosecond- or femtosecond-based laser. In a specific embodiment, the nanosecond-, picosecond- or femtosecond-based laser is also moveable. The overall footprint of the laser scribe apparatus 510 may be, in one embodiment, approximately 2240 millimeters by approximately 1270 millimeters, as depicted in FIG. 5.

In an embodiment, the one or more plasma etch chambers 508 is an Applied Centura® Silvia™ Etch system, available from Applied Materials of Sunnyvale, Calif., USA. The etch chamber may be specifically designed for a silicon etch or treatment used in a process to create features in or through a single crystalline silicon substrate or wafer. On the other hand, the etch chamber may be specifically designed for a silicon dioxide etch or treatment used in a process to create features in or through a glass substrate or wafer. In an embodiment, a high-density plasma source is included in the plasma etch chamber 508 to facilitate high silicon or glass etch rates. In an embodiment, more than one etch chamber is included in the cluster tool 506 portion of process tool 500 to enable high manufacturing throughput of the patterning process.

The factory interface 502 may be a suitable atmospheric port to interface between an outside manufacturing facility with laser scribe apparatus 510 and cluster tool 506. The factory interface 502 may include robots with arms or blades for transferring wafers (or carriers thereof) from storage units (such as front opening unified pods) into either cluster tool 506 or laser scribe apparatus 510, or both.

Cluster tool 506 may include other chambers suitable for performing functions in a method of substrate patterning. For example, in one embodiment, in place of an additional etch chamber, a deposition chamber 512 is included. The deposition chamber 512 may be configured for mask deposition on or above a wafer or substrate prior to laser scribing the wafer or substrate. In one such embodiment, the deposition chamber 512 is suitable for depositing a mask layer such as mask layer 310 or 410 described above. In another embodiment, in place of an additional etch chamber, a wet/dry station 514 is included. The wet/dry station may be suitable for cleaning residues and fragments, or for removing a water soluble mask, e.g., subsequent to a laser scribe and plasma etch patterning process. In another embodiment, the deposition chamber 512 is suitable for depositing a UV-curable mask layer, and a UV source is included with the tool. In an embodiment, a metrology station is also included as a component of process tool 500.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with process tool 500 described in association with FIG. 5. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
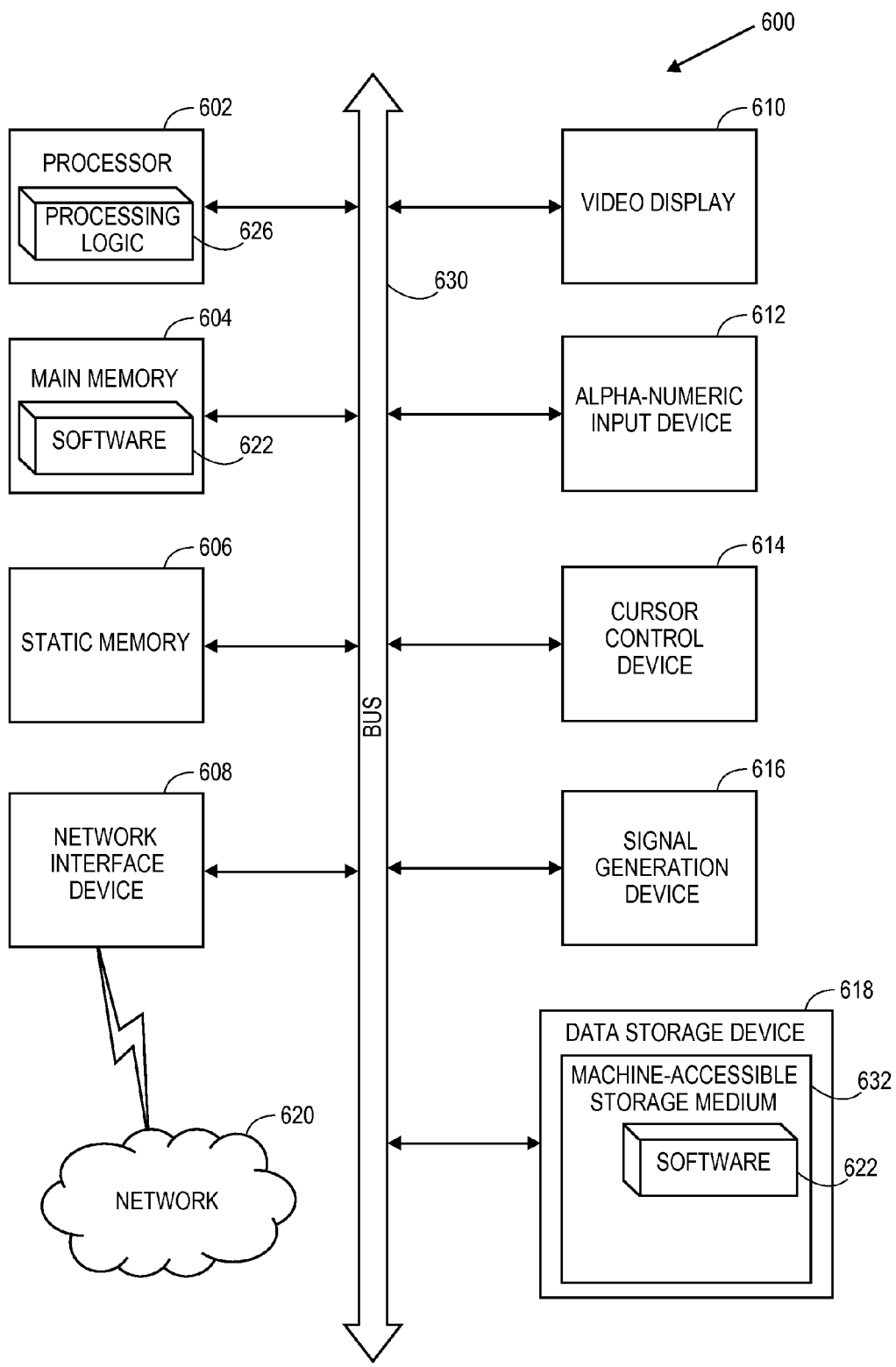
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media. In accordance with an embodiment of the present invention, a machine-accessible storage medium has instructions stored thereon which cause a data processing system to perform an above described method of patterning a semiconductor or glass wafer or substrate.

Thus, approaches for patterning semiconductor or other wafers and dies have been disclosed.

What is claimed is:

1. A method of patterning features within a silicon substrate, the method comprising:
    forming an insulating layer formed on the surface of the silicon substrate;
    forming a mask layer on a surface of a silicon substrate;
    laser ablating the mask layer and the insulating layer to provide a pattern of openings through the mask layer and in the insulating layer; and wherein the laser ablating comprises a picosecond laser using a single pulse ablation process;
    plasma etching portions of the silicon substrate through the pattern of openings to provide a plurality of trenches extends through the entire thickness of the silicon substrate without dicing the silicon substrate, the plurality of trenches having a pattern corresponding to the pattern of openings and comprising a pattern of redistribution layer (RDL) openings;
    and
    subsequent to the plasma etching, removing the mask layer using a plasma ashing or wet cleaning process; wherein the laser ablating comprises laser ablating the mask layer but not the insulating layer, and wherein the plasma etching further comprises etching portions of the insulating layer through the openings to provide the pattern in the insulating layer and wherein the plasma etching is an ultra-high-density plasma source.

2. The method of claim 1, wherein the pattern of the plurality of trenches is a pattern of through-silicon-via (TSV) openings.

3. The method of claim 1, wherein each of the plurality of trenches extends through the entire thickness of the silicon substrate.

4. The method of claim 1, wherein forming the mask layer comprises forming a layer of polyimide or a layer of polyvinyl alcohol (PVA).

5. A method of patterning features within a silicon substrate, the method comprising:
- forming an insulating layer formed on the surface of the silicon substrate;
- forming a mask layer on a surface of a silicon substrate, wherein forming the mask layer comprises forming a layer of polyimide or a layer of polyvinyl alcohol (PVA);
- laser ablating the mask layer and the insulating layer to provide a pattern of openings through the mask layer and in the insulating layer, and wherein the laser ablating comprises a picosecond laser using a single pulse ablation process;
- plasma etching portions of the silicon substrate through the pattern of openings to provide a plurality of trenches extends through the entire thickness of the silicon substrate without dicing the silicon substrate, the plurality of trenches having a pattern corresponding to the pattern of openings and comprising a pattern of through-substrate-via openings or redistribution layer (RDL) openings;

and

- subsequent to the plasma etching, removing the mask layer using a plasma ashing or wet cleaning process;
- wherein the laser ablating comprises laser ablating the mask layer but not the insulating layer, and wherein the plasma etching further comprises etching portions of the insulating layer through the openings to provide the pattern in the insulating layer and wherein the plasma etching is an ultra-high-density plasma source.

* * * * *